(12) United States Patent
Yano et al.

(10) Patent No.: US 9,012,786 B2
(45) Date of Patent: Apr. 21, 2015

(54) CIRCUIT BOARD FOR HIGH-CAPACITY MODULES, AND A PRODUCTION METHOD OF THE CIRCUIT BOARD

(71) Applicant: NGK Insulators, Ltd., Nagoya (JP)

(72) Inventors: Shinsuke Yano, Nagoya (JP); Takami Hirai, Toyota (JP); Tsutomu Nanataki, Toyoake (JP); Hirofumi Yamaguchi, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 157 days.

(21) Appl. No.: 13/708,174

(22) Filed: Dec. 7, 2012

(65) Prior Publication Data
US 2013/0146339 A1 Jun. 13, 2013

Related U.S. Application Data
(63) Continuation of application No. PCT/JP2011/078390, filed on Dec. 8, 2011.

(51) Int. Cl.
*H05K 1/03* (2006.01)
*H05K 3/22* (2006.01)
(Continued)

(52) U.S. Cl.
CPC .............. *H05K 1/0306* (2013.01); *H05K 3/22* (2013.01); *H05K 1/0263* (2013.01); *H01L 23/15* (2013.01); *H01L 23/36* (2013.01); *H01L 23/3735* (2013.01); *H01L 23/49822* (2013.01); *H01L 23/49833* (2013.01); *H01L 25/072* (2013.01); *H05K 1/0231* (2013.01); *H05K 1/162* (2013.01); *H05K 2201/0195* (2013.01); *H05K 2203/1126* (2013.01); *H01L 2224/48091* (2013.01); *H01L 2224/48137* (2013.01); *H01L 2224/48227* (2013.01); *H01L 2924/10272* (2013.01); *H01L 2924/1033* (2013.01); *H01L 2924/1203* (2013.01); *H01L 2924/13055* (2013.01); *H01L 2924/13091* (2013.01);
(Continued)

(58) Field of Classification Search
CPC .... H05K 1/0306; H05K 1/0263; H05K 1/162
USPC .......... 174/252, 256–258; 361/748, 763, 762, 361/784
See application file for complete search history.

(56) References Cited

FOREIGN PATENT DOCUMENTS

| EP | 1 739 740 A2 | 1/2007 |
|---|---|---|
| JP | 3410696 B2 | 3/2003 |

(Continued)

OTHER PUBLICATIONS

International Search Report and Written Opinion dated Mar. 13, 2012.

*Primary Examiner* — Hoa C Nguyen
*Assistant Examiner* — Amol Patel
(74) *Attorney, Agent, or Firm* — Burr & Brown, PLLC (57) ABSTRACT

A circuit board including a substrate having first and second dielectric layers of first and second dielectrics, the second dielectric containing 8 mass % or more of a glass net former component. At least one portion of an inner layer electrode has approximately two principal surfaces parallel to principal surfaces of the circuit board and a thickness of not less than 50 micrometers in a normal direction of the principal surfaces. The inner layer electrode and second dielectric layer contact with each other, and a ratio t/T of sum total thickness t of the second dielectric layer in contact with the inner layer electrode in a normal direction of the principal surface to sum total thickness T of the first dielectric layer in a normal direction of the principal surface is 0.1 or more.

14 Claims, 3 Drawing Sheets

(51) Int. Cl.
*H05K 1/02* (2006.01)
*H01L 23/15* (2006.01)
*H01L 23/36* (2006.01)
*H01L 23/373* (2006.01)
*H01L 23/498* (2006.01)
*H01L 25/07* (2006.01)
*H05K 1/16* (2006.01)

(52) U.S. Cl.
CPC ............... *H01L 2924/15192* (2013.01); *H01L 2924/3512* (2013.01); *H01L 2924/30107* (2013.01)

(56) References Cited

FOREIGN PATENT DOCUMENTS

| | | |
|---|---|---|
| JP | 2005-129624 A1 | 5/2005 |
| JP | 2006-303006 A1 | 11/2006 |
| JP | 2007-012831 A1 | 1/2007 |
| JP | 2008-270778 A1 | 11/2008 |
| JP | 2008270778 A  * | 11/2008 |
| JP | 2009-141288 A1 | 6/2009 |
| JP | 2011-023654 A1 | 2/2011 |

* cited by examiner

CIRCUIT BOARD FOR HIGH-CAPACITY MODULES, AND A PRODUCTION METHOD OF THE CIRCUIT BOARD

BACKGROUND OF THE INVENTION

1. Field of the Invention

The present invention relates to a circuit board for high-capacity modules. More particularly, the present invention relates to a circuit board used in high-capacity modules including power modules, such as an inverter used in electric vehicles (for example, a hybrid car (HV), an electric vehicle (EV), etc.) and various electric appliances, etc. Moreover, the present invention relates also to a production method of the circuit board.

2. Description of Related Art

Recently, in electric vehicles (for example, a hybrid car (HV), an electric vehicle (EV), etc.) and various electric appliances, etc., high-capacity (large electric power) modules including power modules, such as an inverter, are used increasingly widely. Generally, such a high-capacity (large electric power) module includes, for example, a circuit (may be referred to as a "power circuit" henceforth) containing a power semiconductor element, such as a switching element (for example, IGBT (Insulated Gate Bipolar Transistor), etc.) and, for example, a peripheral circuit (may be referred to as a "drive circuit" henceforth) which controls such a power semiconductor element.

In addition, in the present specification, a high-capacity module refers to a module handling a voltage of 200V or more, or a large electric power of 10 A or more. As a specific example of such a high-capacity module, for example, what is called a "power module" etc. can be exemplified.

In a high-capacity module as mentioned above, reduction of a noise which arises, for example from a power semiconductor element, such as a switching element, has been an important technical subject. Specifically, for example, an abnormality may arise in switching operation of a switching element due to a noise which arises as a result of switching operation of the switching element and lead to destruction of a power circuit containing a power semiconductor element, such as a switching element, or a peripheral circuit. Furthermore, such a noise may be revealed to the exterior of a high-capacity module to affect operation of a peripheral equipment of the high-capacity module.

Additionally, in the art, as a remedy for loss in a power semiconductor element including, for example, IGBT, MOSFET, etc., technology trends, which use a silicon carbide (SiC) wafer or a gallium nitride (GaN) wafer in place of a silicon (Si) wafer used conventionally, are becoming remarkable (for example, SiC-IGBT, SiC-MOSFET, GaN-IGBT, GaN-MOSFET, etc.). In a semiconductor element which uses such a new type of wafer, since operation in higher switching frequency is attained as compared with a semiconductor element which uses a conventional Si wafer, there is an advantage that miniaturization of a high-capacity module is attained. However, since the frequency of a noise which arises from these semiconductor elements also rises with the rise of switching frequency, problems resulting from a noise as mentioned above also become more serious. Therefore, in a high-capacity module, reduction of a noise which arises from a power semiconductor element has been an increasingly important technical subject.

It is known that it is effective as a countermeasure for a noise as mentioned above to connect a capacitor (what is called a "snubber capacitor") in parallel with a power semiconductor. A snubber capacitor has an effect which suppresses voltage change accompanying switching operation of a power semiconductor element. In order to reduce a noise more effectively by such a snubber capacitor, it is necessary to shorten distance between a power semiconductor element and a snubber capacitor. It is because the longer a wiring (wire) which electrically connects a power semiconductor element and a snubber capacitor becomes, the larger an equivalent inductance of the wiring becomes, and thereby surge voltage induced due to a noise which arises with switching operation increases, and as a result a noise reduction effect by the snubber capacitor is not sufficiently demonstrated.

Figure 1:
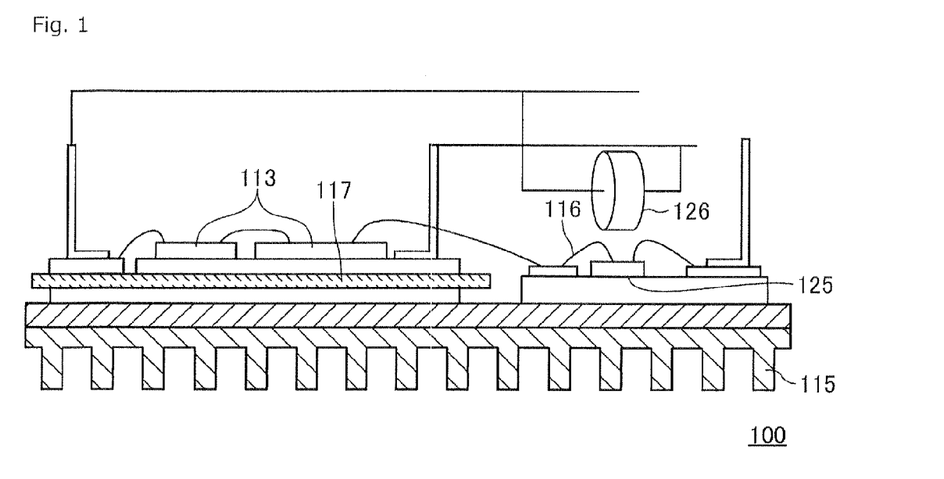
FIG. 1 A schematic view showing the configuration of a high-capacity module according to one embodiment of a conventional technology.

However, in a conventional high-capacity module, as shown, for example, in FIG. 1, since it is necessary to attach an external snubber capacitor 126 to the exterior of a high-capacity module 100, the wiring (wire) which electrically connects a power semiconductor element 113 and the snubber capacitor 126 becomes long, and could not sufficiently demonstrate a noise reduction effect by the snubber capacitor 126. In addition, in a conventional high-capacity module, a power circuit containing the power semiconductor element 113 and a peripheral circuit which contains the control circuit element 125 which controls the power semiconductor element 113, for example, are arranged planarly, and an area for arranging a wiring (wire) 116 for connecting these circuits is required. These have been factors in preventing a high-capacity module 100 from reduction in size and weight. Moreover, problems such as long wiring length due to wire distribution which connects the various circuits which constitute the high-capacity modules 100 as mentioned above and large loss as a whole module, have been also recognized.

Figure 2:
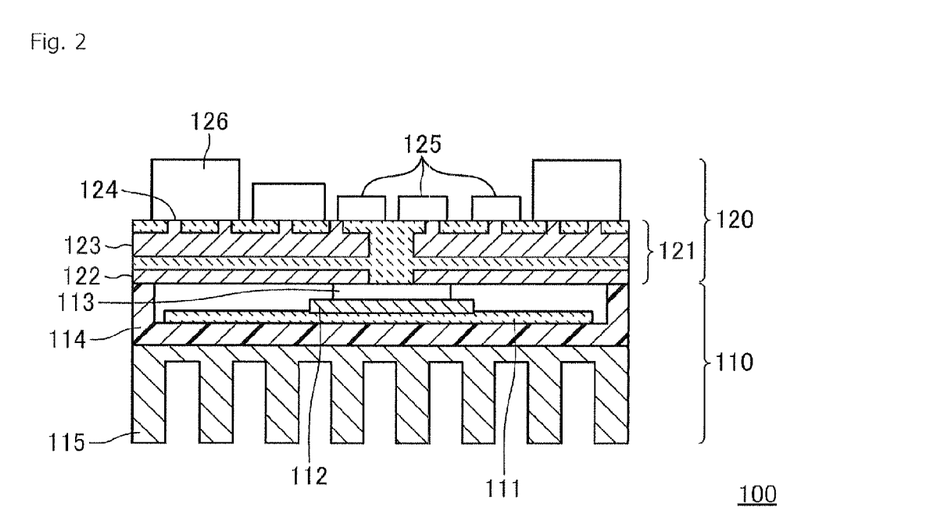
FIG. 2 A schematic view showing the configuration of a high-capacity module according to another embodiment of a conventional technology.

Then, it has been proposed to attempt to laminate substrates of various circuits which constitute a high-capacity module as mentioned above to attain reduction in size and weight of the high-capacity module as well as improve a connection form between the various circuit boards which constitute the high-capacity module to attain reduction in loss of the high-capacity module (refer to PTL 1 to 3). Moreover, in the art, as shown, for example, in FIG. 2, in a high-capacity module 100 which has such a laminated structure, a configuration where a snubber capacitor 126 is mounted on a circuit board 121 of a peripheral circuit (drive circuit) 120 which controls a power semiconductor element 113 has been proposed. Although such a configuration can shorten a wiring (wire) which electrically connects the power semiconductor element 113 and the snubber capacitor 126, as compared with a configuration where a snubber capacitor 126 is disposed in the exterior of a high-capacity module 100 as previously mentioned, its effect is restrictive and further reduction in surge has been demanded.

Figure 3:
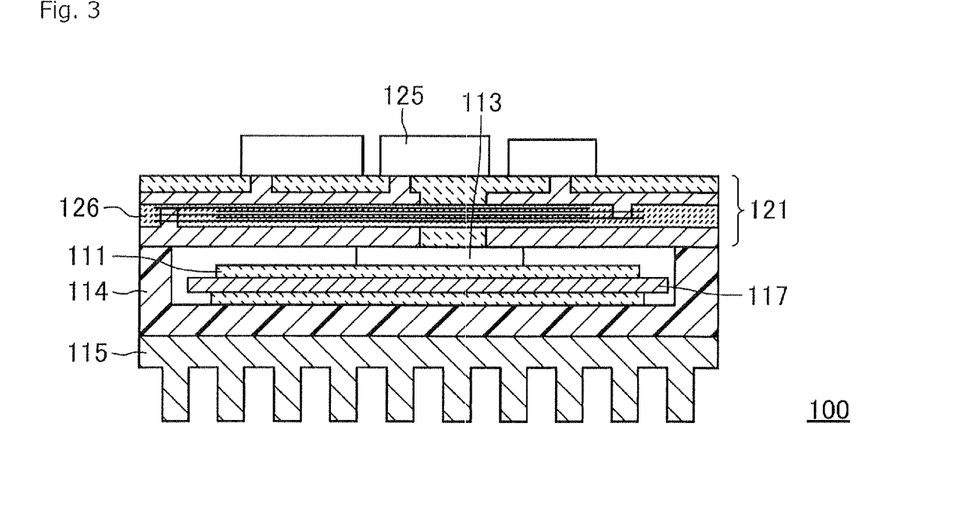
FIG. 3 A schematic view showing the configuration of a high-capacity module according to further embodiment of a conventional technology.

Then, in the art, as shown, for example, in FIG. 3, in a high-capacity module 100 which has a laminated structure as mentioned above, a configuration where a snubber capacitor 126 is embedded inside a peripheral circuit (drive circuit) board 121 has been also proposed. According to such a configuration, wiring which electrically connects a power semiconductor element 113 and the snubber capacitor 126 can be further shortened.

On the other hand, for example, in a circuit board which uses ceramics as a substrate, when an inner layer electrode, which is embedded inside a circuit board, and a substrate are simultaneously sintered, since a ceramics material which constitutes a substrate has a behavior in densification (contraction profile) different from that of a conductor (for example, metal) which constitutes an inner layer electrode, a stress resulting from difference of amount of contraction between the substrate and electrode acts. Especially, in a circuit board assumed to be used in a high-capacity module, although it is desirable to enlarge thickness of an inner layer electrode in order to reduce loss as a whole module, the larger the thickness of the inner layer electrode becomes, the larger the stress resulting from a difference in the amount of contraction between the substrate and the electrode becomes, and therefore a possibility for a problem, such as a crack arises in the substrate due to the stress, to occur increases. When a crack arises in a substrate, moisture may enter through the crack to lead to corrosion of an inner layer electrode and decrease in insulation property, and may further lead to disconnection of the inner layer electrode.

As the above, in the art, there has been a demand for a circuit board including a substrate consisting of dielectric layer(s) comprising mainly ceramics for a high-capacity module, wherein an inner layer electrode embedded inside the circuit board and the substrate are simultaneously sinterable without an occurrence of a crack in the substrate.

CITATION LIST

Patent Literature

[PTL 1] Japanese Patent Application Laid-Open (kokai) No. 2006-303006
[PTL 2] Japanese Patent No. 3410696
[PTL 3] Japanese Patent Application Laid-Open (kokai) No. 2011-23654
[PTL 4] Japanese Patent Application Laid-Open (kokai) No. 2007-012831

SUMMARY OF INVENTION

Technical Problem

As mentioned above, in the art, there has been a demand for a circuit board including a substrate consisting of dielectric layer(s) comprising mainly ceramics for a high-capacity module, wherein an inner layer electrode embedded inside the circuit board and the substrate are simultaneously sinterable without an occurrence of a crack in the substrate.

The present invention has been conceived in order to meet such a demand. More specifically, the present invention has an objective to provide a circuit board including a substrate consisting of dielectric layer(s) comprising mainly ceramics for a high-capacity module, wherein an inner layer electrode embedded inside the circuit board and the substrate are simultaneously sinterable without an occurrence of a crack in the substrate.

Solution to Problem

The above-mentioned purpose can be achieved by;
a circuit board obtained by simultaneously sintering a substrate which mainly comprises ceramics and an inner layer electrode which comprises a conductive material embedded inside said substrate, wherein:
said substrate comprises at least one first dielectric layer which consists of a first dielectric and at least one second dielectric layer which consists of a second dielectric,
said second dielectric contains 8 mass % or more of a glass net former component,
at least one portion of said inner layer electrode has two principal surfaces which are approximately parallel to principal surfaces of said circuit board and a thickness of not less than 50 micrometers in a normal direction of the principal surfaces of said circuit board,
on at least one of said two principal surfaces which said inner layer electrode has, said inner layer electrode and said second dielectric layer contact with each other, and
a ratio t/T of sum total thickness t of said second dielectric layer in contact with said inner layer electrode in a normal direction of the principal surface of said circuit board to sum total thickness T of said first dielectric layer in a normal direction of the principal surface of said circuit board is 0.1 or more.

Advantageous Effects of Invention

As mentioned above, in the circuit board according to the present invention equipped with the substrate which consist of a dielectric layer(s) which mainly comprises ceramics and an inner layer electrode embedded inside the circuit board, the content rate of the glass net former component in the dielectric layer which contacts with the inner layer electrode on at least one of two principal surfaces approximately parallel to the principal surfaces of the circuit board, which the inner layer electrode has, is not less than a predetermined value, and the ratio (t/T) of sum total thickness (t) of the (second) dielectric layer which contains the glass net former component at a content rate of not less than a predetermined value to sum total thickness (T) of the (first) dielectric layer which does not contain the glass net former component at the content rate of not less than the predetermined value is a predetermined value or more, and thereby the substrate and the inner layer electrode can be simultaneously sintered without an occurrence of a crack in the substrate.

DETAILED DESCRIPTION OF THE INVENTION

As mentioned above, the present invention has an objective to provide a circuit board including a substrate consisting of dielectric layer(s) comprising mainly ceramics for a high-capacity module, wherein an inner layer electrode embedded inside the circuit board and the substrate are simultaneously sinterable without an occurrence of a crack in the substrate.

As a result of wholehearted research for achieving the above-mentioned objective, the present inventors have found that, in the circuit board equipped with the substrate which consists of dielectric layer(s) which mainly comprises ceramics and an inner layer electrode embedded inside the circuit board, the content rate of the glass net former component in the dielectric layer which contacts with the inner layer electrode on at least one of two principal surfaces approximately parallel to the principal surfaces of the circuit board, which the inner layer electrode has, is not less than a predetermined value, and the ratio (t/T) of sum total thickness (t) of the (second) dielectric layer which contains the glass net former component at a content rate of not less than a predetermined value to sum total thickness (T) of the (first) dielectric layer which does not contain the glass net former component at the content rate of not less than the predetermined value is a predetermined value or more, and thereby the substrate and the inner layer electrode can be simultaneously sintered without an occurrence of a crack in the substrate, and have come to conceive the present invention.

Namely, the first embodiment of the present invention is;

a circuit board obtained by simultaneously sintering a substrate which mainly comprises ceramics and an inner layer electrode which comprises a conductive material embedded inside said substrate, wherein:

said substrate comprises at least one first dielectric layer which consists of a first dielectric and at least one second dielectric layer which consists of a second dielectric, said second dielectric contains 8 mass % or more of a glass net former component, at least one portion of said inner layer electrode has two principal surfaces which are approximately parallel to principal surfaces of said circuit board and a thickness of not less than 50 micrometers in a normal direction of the principal surfaces of said circuit board, on at least one of said two principal surfaces which said inner layer electrode has, said inner layer electrode and said second dielectric layer contact with each other, and a ratio t/T of sum total thickness t of said second dielectric layer in contact with said inner layer electrode in a normal direction of the principal surface of said circuit board to sum total thickness T of said first dielectric layer in a normal direction of the principal surface of said circuit board is 0.1 or more.

As mentioned above, a circuit board according to the present embodiment is a circuit board obtained by simultaneously sintering a substrate which mainly comprises ceramics and an inner layer electrode which comprises a conductive material embedded inside the substrate. The circuit board according to the present embodiment may include a further surface electrode for attaining electric connection with various circuit elements disposed on the present circuit board, another circuit board other than the present circuit board, or various circuit elements disposed outside the present circuit board (for example, various circuit elements disposed on a circuit board other than the present circuit board), etc.

By the way, a method for manufacturing a circuit board according to the present embodiment may be any kind of method as long as the above-mentioned requirements are satisfied, and can be properly chosen from various methods used for manufacturing a substrate made of ceramics in the art. As a specific example of methods for manufacturing a substrate according to the present embodiment, for example, what is called a "gel-cast method" and a "doctor blade method", etc. can be exemplified.

When adopting the above-described gel-cast method, a circuit board according to the present embodiment can be obtained, for example, by disposing a conductive pattern on the surface of a film-like or sheet-like protective backing material by a printing method, such as a screen printing method, etc., injecting a slurry of a dielectric material, such as ceramics, into the portion in which the conductive pattern has not been disposed, laminating required number of sheets of a dielectric material with the conductive pattern embedded therein, which is obtained by solidifying the slurry to constitute the conductive pattern as surface electrode(s) or inner layer electrode(s), and sintering the same.

As the above-mentioned protective backing material, it is desirable to use resin films, such as a polyethylene terephthalate (PET) film, a polyethylene naphthalate (PEN) film and, besides resin films, various film-like or sheet-like materials, such as a glass board, paper, or metal, can be used. However, as protective backing material, it is preferable to use those with flexibility from a viewpoint of the ease of peel-off operation.

Moreover, for example, for the objective of enabling it to easily peel off the sheet of the dielectric material from the protective backing material, etc., for example, a release agent etc. may be applied to the surface of the above-mentioned protective backing material. Such a release agent includes, for example, various agents known as mold lubricant in the art. More specifically, as such a release agent, well-known silicone series release agents, fluorine series release agents, and etc. can be used.

The above-mentioned conductive pattern can be formed by using any conductive material properly chosen from various conductive materials well-known in the art, as long as the resultant conductive pattern can present good conductivity without causing problems, such as deformation of the conductive pattern or degradation of its electric conduction characteristic, in the manufacture process of the circuit board according to the present embodiment. It is desirable that the above-mentioned conductive pattern is disposed by forming a conductive paste, which comprises, as main components, at least one or more kinds of metal chosen from, for example, gold (Au), silver (Ag), and copper (Cu), etc. and a thermosetting resin precursor, on the surface of the above-mentioned protective backing material, by a method, such as a screen printing, etc. As such a thermosetting resin precursor, phenol resin, resole resin, urethane resin, epoxy resin, melamine resin, etc. can be used. Among these, phenol resin and resole resin are especially preferable. After printing such a conductive paste on the surface of the above-mentioned protective backing material, a conductive pattern can be obtained by hardening the binder contained in the conductive paste.

As a slurry of the above-mentioned dielectric material, for example, a slurry which comprises resin, ceramics powder, and a solvent can be exemplified. In this case, resin can function as what is called a "binder" and, for example, thermosetting resin, such as phenol resin, resole resin, or polyurethane resin, or a polyurethane precursor which comprises polyol and polyisocyanate can be used. Among these, a thermosetting resin precursor which comprises polyol and polyisocyanate is especially preferable.

As a ceramics material used as ceramics powder, any of oxide series ceramics or non-oxide series ceramics can be used. For example, alumina ($Al_2O_3$), zirconia ($ZrO_2$), barium titanate ($BaTiO_3$), silicon nitride ($Si_3N_4$), silicon carbide (SiC), barium oxide (BaO), titanium oxide ($TiO_2$), oxidized silicon ($SiO_2$), zinc oxide ($ZnO_2$), neodymium oxide ($Nd_2O_3$), etc. can be used. Moreover, these materials may be used solely or in combination of two or more kinds thereof. Furthermore, as long as a slurry can be prepared, particle size of ceramics material is not particularly limited. In addition, it is needless to say that, as a matter of course, a glass net former component blended so that the above-mentioned content might be attained is also used in a ceramics material which constitutes the above-mentioned second dielectric.

Moreover, the above-mentioned solvent is not particularly limited, as long as it can dissolve resin as the above-mentioned binder (and a dispersing agent, when used). As a specific example of the solvent, a solvent which has two or more ester bonds, such as polybasic acid ester (for example, dimethyl glutarate, etc.) and acid ester of polyhydric alcohol (for example, triacetin (glyceryl triacetate) etc.), etc, can be exemplified.

Furthermore, a slurry of the above-mentioned dielectric material may contain a dispersing agent in addition to the above-mentioned resin, ceramics powder, and solvent. As a specific example of a dispersing agent, for example, polycarboxylic acid series copolymers, polycarboxylic acid salts, etc. can be exemplified. By adding such a dispersing agent, a slurry before molding can have low viscosity and high flowability.

As mentioned previously, it is assumed that a circuit board according to the present invention is used in large capacity (large electric power) modules including, for example, power modules, such as an inverter. Therefore, as for at least one portion of an inner layer electrode which a circuit board according to the present invention includes, it is desirable to have a cross-sectional area large enough to transmit large current. Thereby, loss as a whole module including an electronic circuit which uses a circuit board according to the present embodiment can be decreased. Specifically, in a circuit board according to the present embodiment, as mentioned above, it is desirable that at least one portion of the inner layer electrode has a thickness of not less than 50 micrometers, more preferably not less than 100 micrometers, in a normal direction of the principal surfaces of the circuit board. When a thickness in a normal direction of the principal surfaces of the circuit board of the inner layer electrode is less than 50 micrometers, it is not desirable since it is insufficient for transmitting large current and loss as a whole high-capacity module using the circuit board becomes large.

On the other hand, as mentioned previously, for example, in a circuit board which uses ceramics as a substrate, when an inner layer electrode, which is embedded inside a circuit board, and a substrate are simultaneously sintered, since a ceramics material which constitutes a substrate has a behavior in densification (contraction profile) different from that of a conductor (for example, metal) which constitutes an inner layer electrode, a stress resulting from difference of amount of contraction between the substrate and electrode acts. Especially, in a circuit board assumed to be used in a high-capacity module, although it is desirable to enlarge thickness of an inner layer electrode in order to reduce loss as a whole module, the larger the thickness of the inner layer electrode becomes, the larger the stress resulting from difference of amount of contraction between the substrate and the electrode becomes, and therefore a possibility for a problem, such as a crack arises in the substrate due to the stress, to occur increases. When a crack arises in a substrate, for example, moisture may enter through the crack to lead to corrosion of an inner layer electrode and decrease in insulation property, and may further lead to disconnection of the inner layer electrode.

Then, as a result of wholehearted research, the present inventors have found that, the content rate of the glass net former component in the dielectric layer which contacts with the inner layer electrode on at least one of two principal surfaces approximately parallel to the principal surfaces of the circuit board, which the inner layer electrode has, is not less than a predetermined value, and the ratio (t/T) of sum total thickness (t) of the (second) dielectric layer which contains the glass net former component at a content rate of not less than a predetermined value to sum total thickness (T) of the (first) dielectric layer which does not contain the glass net former component at the content rate of not less than the predetermined value is a predetermined value or more, and thereby the substrate and the inner layer electrode can be simultaneously sintered without an occurrence of a crack in the substrate.

Specifically, in a circuit board according to the present invention, as mentioned previously, said substrate comprises at least one first dielectric layer which consists of a first dielectric and at least one second dielectric layer which consists of a second dielectric, said second dielectric contains 8 mass % or more of a glass net former component, on at least one of said two principal surfaces which said inner layer electrode has, said inner layer electrode and said second dielectric layer contact with each other, and a ratio t/T of sum total thickness t of said second dielectric layer in contact with said inner layer electrode in a normal direction of the principal surface of said circuit board to sum total thickness T of said first dielectric layer in a normal direction of the principal surface of said circuit board is 0.1 or more.

As mentioned above, a substrate constituting a circuit board according to the present embodiment comprises at least one first dielectric layer which consists of a first dielectric and at least one second dielectric layer which consists of a second dielectric, and the second dielectric contains a predetermined amount of a glass net former component. Thereby, when sintering the circuit board, the second dielectric layer can soften to larger extent as compared with the first dielectric layer and demonstrate flowability to some extent.

In addition, as mentioned above, a circuit board according to the present embodiment is configured so that, on at least one of the two principal surfaces which the inner layer electrode has, the inner layer electrode and the second dielectric layer contact with each other. Therefore, in a circuit board according to the present embodiment, stress resulting from difference of contraction profile between a substrate and an electrode when sintering a circuit board, as mentioned above, can be relaxed. In addition, in order to attain such stress relaxation, at all the interfaces of the inner layer electrode and the substrate, the inner layer electrode and the second dielectric layer may contact with each other. However, according to knowledge of the present inventors, the inner layer electrode and the second dielectric layer need not to contact with each other at all the interfaces of the inner layer electrode and the substrate. Namely, in a circuit board according to the present embodiment, what is necessary is to just be configured so that, as mentioned above, on at least one of the two principal surfaces which the inner layer electrode has, the inner layer electrode and the second dielectric layer may contact with each other.

It is believed that the above is because, in a configuration wherein the inner layer electrode and the second dielectric layer contact with each other only on one of the two principal surfaces which the inner layer electrode has, since the first dielectric layer which contacts with the inner layer electrode on another principal surface of the two principal surfaces which the inner layer electrode inside has does not present flowability like the second dielectric layer when sintering a circuit board, although contraction in an in-plane direction of the inner layer electrode on the principal surface is restrained by the first dielectric layer, on the side which contacts with the second dielectric layer of the two principal surfaces which the inner layer electrode has, an inner layer electrode not only can contract in an in-plane direction of the principal surface, but also it can contract to a normal direction (namely, a thickness direction) of the principal surface by virtue of flowability which the second dielectric layer presents when sintering a circuit board, and therefore, as a whole, stress resulting from difference of contraction profile between a substrate and an electrode when sintering a circuit board, as mentioned above, can be relaxed.

In addition, in order to make it possible to attain stress relaxation as mentioned above and simultaneously sinter the substrate and the inner layer electrode without an occurrence of a crack in the substrate, it is necessary that, as mentioned previously, a content rate of a glass net former component in a dielectric layer which contacts the inner layer electrode on at least one of two principal surfaces approximately parallel to the principal surfaces of the circuit board, which the inner layer electrode has, is not less than a predetermined value, and that the ratio (t/T) of sum total thickness (t) of the (second) dielectric layer which contains the glass net former component at a content rate of not less than a predetermined value to sum total thickness (T) of the (first) dielectric layer which does not contain the glass net former component at the content rate of not less than the predetermined value is a predetermined value or more.

Specifically, in a circuit board according to the present embodiment, it is desirable that the second dielectric contains 8 mass % or more, more preferably 10 mass % or more, of a glass net former component. When the content of the glass net former component in the second dielectric is less than the 8 mass %, it is not desirable since the second dielectric layer cannot soften sufficiently and demonstrate sufficient flowability to relax stress resulting from difference of contraction profile between the substrate and the electrode on sintering of the circuit board as mentioned previously.

Moreover, in a circuit board according to the present embodiment, it is desirable that a ratio t/T of sum total thickness t of the second dielectric layer in contact with the inner layer electrode in a normal direction of the principal surface of the circuit board to sum total thickness T of the first dielectric layer in a normal direction of the principal surface of the circuit board is 0.1 or more, more preferably 0.2 or more. When the ratio t/T is less than 0.1, it is not desirable since the second dielectric cannot demonstrate sufficient flowability to relax stress resulting from difference of contraction profile between the substrate and the electrode on sintering of the circuit board as mentioned previously, even if the content of the glass net former component in the second dielectric is more than 8 mass %.

In addition, for example, when a plurality of first dielectric layers are disposed in a circuit board, sum total thickness T of the first dielectric layer in a normal direction of the principal surface of the circuit board refers to sum total value of thicknesses of these first dielectric layers in a normal direction of the principal surface of the circuit board. Specifically, for example, when two first dielectric layers are disposed in a circuit board and the thicknesses of these two first dielectric layers in a normal direction of the principal surface of the circuit board are respectively T1 and T2, the sum total thickness T refers to T1+T2. Similarly, for example, when a plurality of second dielectric layers are disposed in a circuit board, sum total thickness t of the second dielectric layer in contact with the inner layer electrode in a normal direction of the principal surface of the circuit board refers to sum total value of thicknesses of these second dielectric layers in a normal direction of the principal surface of the circuit board. Specifically, for example, when two second dielectric layers are disposed in a circuit board and the thicknesses of these two second dielectric layers in a normal direction of the principal surface of the circuit board are respectively t1 and t2, the sum total thickness t refers to t1+t2.

However, in case where there is a second dielectric layer in contact with neither of the two principal surfaces which an inner layer electrode has in a circuit board, for example, when a first dielectric layer contacts with one of the two principal surfaces which the inner layer electrode has and the second dielectric layer is disposed on the side opposite to the inner layer electrode of the first dielectric layer, thickness of the second dielectric layer is not included in the sum total thickness t. This is because a second dielectric layer in contact with neither of the two principal surfaces which an inner layer electrode has does not contribute to achieve stress relaxation as mentioned previously.

As the above, in the circuit board according to the present embodiment equipped with the substrate which consists of dielectric layer(s) which mainly comprises ceramics and an inner layer electrode embedded inside the circuit board, the content rate of a glass net former component in the dielectric layer which contacts with the inner layer electrode on at least one of two principal surfaces approximately parallel to the principal surfaces of the circuit board, which said inner layer electrode has, is not less than a predetermined value (specifically, 8 mass % or more), and the ratio (t/T) of sum total thickness (t) of the (second) dielectric layer which contains the glass net former component at a content rate of not less than a predetermined value to sum total thickness (T) of the (first) dielectric layer which does not contain the glass net former component at the content rate of not less than the predetermined value is a predetermined value or more (specifically 0.1 or more), and thereby the substrate and the inner layer electrode can be simultaneously sintered without an occurrence of a crack in the substrate.

Moreover, in a circuit board according to the present embodiment, since at least one portion of the inner layer electrode has a thickness of not less than 50 micrometers in a normal direction of the principal surface of the circuit board, loss as a whole module including an electronic circuit which uses a circuit board according to the present embodiment can be decreased.

By the way, as mentioned previously, in a high-capacity module, for example, an abnormality may arise in switching operation of a switching element due to a noise which arises as a result of switching operation of the switching element and lead to destruction of a power circuit containing a power semiconductor element, such as a switching element, or a peripheral circuit. Furthermore, such a noise may be revealed to the exterior of a high-capacity module to affect operation of a peripheral equipment of the high-capacity module. Additionally, in a new type of a power semiconductor element (for example, SiC-IGBT, SiC-MOSFET, GaN-IGBT, GaN-MOSFET, etc.) which uses a SiC wafer or a GaN wafer as a remedy for loss in a power semiconductor element including, for example, conventional IGBT, MOSFET, etc., which use a Si wafer, since operation in higher switching frequency is attained as compared with a conventional semiconductor element which uses a Si wafer, there is an advantage that miniaturization of a high-capacity module is attained. However, since the frequency of a noise which arises from these semiconductor elements also rises with the rise of switching frequency, problems resulting from a noise as mentioned above also become more serious. Therefore, in a high-capacity module, reduction of a noise which arises from a power semiconductor element has been an increasingly important technical subject.

As mentioned previously, it is effective as a countermeasure for a noise as mentioned above to connect a capacitor (what is called a "snubber capacitor") in parallel with a power semiconductor. In order to reduce a noise more effectively by such a snubber capacitor, it is necessary to shorten distance between a power semiconductor element and a snubber capacitor. Therefore, as mentioned previously, a configuration where a snubber capacitor is embedded inside a circuit board included in a high-capacity module is desirable.

Moreover, in case where the capacity of a snubber capacitor embedded inside a circuit board is increased to secure the capacity required as a snubber capacitor as mentioned above, when the capacity of the snubber capacitor is increased by increasing the number of laminations of conductors and dielectric inserted between the conductors which constitute the snubber capacitor embedded inside the circuit board, the thickness of the circuit board may increase and prevent a high-capacity module using the circuit board from reduction in size and weight. Therefore, it is desirable to increase the capacity of a snubber capacitor, without increasing the number of laminations of conductors and dielectric inserted between the conductors which constitute the snubber capacitor embedded inside the circuit board (namely, without increasing the thickness of the circuit board) by forming an insulating layer (dielectric layer) which has a high dielectric constant inside the circuit board and constituting a snubber capacitor using the dielectric layer.

From such a viewpoint, the second embodiment of the present invention is;

a circuit board according to the first embodiment of the present invention, wherein:

the dielectric constant of said first dielectric is larger than the dielectric constant of said second dielectric, and said first dielectric layer constitutes a capacitor.

As mentioned above, in the circuit board according to the present embodiment, the dielectric constant of said first dielectric is larger than the dielectric constant of said second dielectric, and said first dielectric layer constitutes a capacitor. For example, a specific configuration of the capacitor can be properly designed according to a design specification of the circuit board according to the present embodiment and a module constituted using the circuit board, etc. For example, in the circuit board according to the present embodiment, a capacitor can be formed in the circuit board by disposing at least one pair of electrodes which comprise a conductive material so as to sandwich at least one portion of the first dielectric layer. Moreover, at least one electrode of the at least one pair of electrodes may be embedded inside the first dielectric layer, or may be disposed on the interface between the first dielectric layer and another component (for example, the second dielectric layer, the inner layer electrode) of the circuit board, or may be exposed on either of two principal surfaces which the circuit board has. Namely, at least one electrode of the at least one pair of electrodes may be the inner layer electrode which the circuit board according to present embodiment includes, or may be a surface electrode disposed so as to be exposed on either of two principal surfaces which the circuit board has.

Moreover, as mentioned above, in the circuit board according to the present embodiment, the dielectric constant of the first dielectric is larger than the dielectric constant of the second dielectric, and the second dielectric layer which has such a large dielectric constant and the electrodes form a capacitor embedded inside a circuit board. Thereby, in the circuit board according to the present embodiment, the capacity of a snubber capacitor can be increased, without increasing the number of laminations of conductors and dielectric inserted between the conductors which constitute the snubber capacitor embedded inside the circuit board (namely, without increasing the thickness of the circuit board). Therefore, in accordance with the circuit board according to the present embodiment, the capacity of a snubber capacitor can be increased, without preventing the high-capacity module using the circuit board from reduction in size and weight.

By the way, in the circuit board according to the present invention, as mentioned previously, the content rate of the glass net former component in the dielectric layer which contacts with the inner layer electrode on at least one of two principal surfaces of the inner layer electrode approximately parallel to principal surfaces of the circuit board is not less than a predetermined value, and the ratio t/T of sum total thickness t of the second dielectric layer which contains the glass net former component at a content rate of not less than a predetermined value to sum total thickness T of the first dielectric layer which does not contain the glass net former component at the content rate of not less than the predetermined value is a predetermined value or more, and thereby the substrate and the inner layer electrode can be simultaneously sintered without an occurrence of a crack in the substrate.

The glass net former component may be a glass net former component with any composition, as long as the second dielectric layer can sufficiently soften without adversely affecting demand characteristics as an electronic circuit card, especially demand characteristics as an electronic circuit board used in a high-capacity module, at the time when sintering the circuit board and the second dielectric layer can demonstrate sufficient flowability to relax stress resulting from difference of contraction profile between a substrate and an electrode when sintering the circuit board. Namely, as the glass net former component, various glass net former well known in the art can be used. As such a glass net former, for example, oxides of silicon (Si), boron (B), germanium (Ge), phosphorus (P), arsenic (As), and vanadium (V), etc. can be exemplified. As major glass net former components, a glass net former component comprising at least either one of silica dioxide ($SiO_2$) and diboron trioxide ($B_2O_3$) can be exemplified.

Therefore, the third embodiment of the present invention is;

the circuit board according to any one of said first or second embodiment of the present invention, wherein:

said glass net former component comprises at least either one of silica dioxide ($SiO_2$) and diboron trioxide ($B_2O_3$).

As mentioned above, in the circuit board according to the present embodiment, said glass net former component comprises at least either one of silica dioxide ($SiO_2$) and diboron trioxide ($B_2O_3$). Namely, the glass net former component may be a glass net former component which comprises either one of silica dioxide ($SiO_2$) and diboron trioxide ($B_2O_3$), and may be a glass net former component which comprises these both.

By the way, as mentioned previously, conductive material included in the inner layer electrode can be properly chosen from various conductive materials well-known in the art, as long as it can present good conductivity in a resulting conductive pattern without producing problems, for example, such as deformation of the conductive pattern or degradation of its electric conduction characteristic, in the manufacture process of the circuit board according to the present invention. In any case, from a viewpoint of reduction in loss in a module using the circuit board according to the present invention, it is desirable that the inner layer electrode consists of a good conductor which has small electrical resistance.

Therefore, the fourth embodiment of the present invention is;

the circuit board according to any one of said first to third embodiments of the present invention, wherein:

said conductive material comprises at least any one sort of gold (Au), silver (Ag), and copper (Cu).

As mentioned above, in the circuit board according to the present embodiment, said conductive material comprises at least any one sort of gold (Au), silver (Ag), and copper (Cu). Thereby, loss in the circuit board according to the present embodiment can be reduced and, as a result, loss as a whole module which uses the circuit board according to the present embodiment can be also reduced.

Although some embodiments as circuit boards according to the present invention have been explained as the above, production methods of the circuit boards according to various embodiments including these embodiments and those modifications are also involved in the scope of the present invention. Then, embodiments as production methods of the circuit boards corresponding to the above-mentioned embodiments as circuit boards according to the present invention are listed below. However, since the explanations about circuit boards and the components of the circuit boards mentioned in the explanations of these production methods have been already described in the explanation about the above-mentioned embodiments as circuit boards according to the present invention, they will not be repeatedly explained below.

Namely, the fifth embodiment of the present invention is;

a production method of a circuit board, to obtain a circuit board by simultaneously sintering a substrate which mainly comprises ceramics and an inner layer electrode which comprises a conductive material embedded inside said substrate, wherein:

said substrate comprises at least one first dielectric layer which consists of a first dielectric and at least one second dielectric layer which consists of a second dielectric, said second dielectric contains 8 mass % or more of a glass net former component, at least one portion of said inner layer electrode has two principal surfaces which are approximately parallel to principal surfaces of said circuit board and a thickness of not less than 50 micrometers in a normal direction of the principal surfaces of said circuit board, on at least one of said two principal surfaces which said inner layer electrode has, said inner layer electrode and said second dielectric layer contact with each other, and a ratio t/T of sum total thickness t of said second dielectric layer in contact with said inner layer electrode in a normal direction of the principal surface of said circuit board to sum total thickness T of said first dielectric layer in a normal direction of the principal surface of said circuit board is 0.1 or more.

Next, the sixth embodiment of the present invention is;

the production method of a circuit board according to said fifth embodiment of the present invention, wherein:

the dielectric constant of said first dielectric is larger than the dielectric constant of said second dielectric, and said first dielectric layer constitutes a capacitor.

Moreover, the seventh embodiment of the present invention, the production method of a circuit board according to any one of said fifth or sixth embodiment of the present invention, wherein:

said glass net former component comprises at least either one of silica dioxide ($SiO_2$) and diboron trioxide ($B_2O_3$).

Furthermore, the eighth embodiment of the present invention, the production method of a circuit board according to any one of said fifth to seventh embodiments of the present invention, wherein:

said conductive material comprises at least any one sort of gold (Au), silver (Ag), and copper (Cu).

As the above, in accordance with the production method of a circuit board according to some embodiments of the present invention, in a circuit board including a substrate which consists of dielectric layer(s) which mainly comprises ceramics and an inner layer electrode embedded inside the circuit board, the content rate of a glass net former component in the dielectric layer which contacts with the inner layer electrode on at least one of two principal surfaces approximately parallel to the principal surfaces of the circuit board, which said inner layer electrode has, is not less than a predetermined value, and the ratio (t/T) of sum total thickness (t) of the (second) dielectric layer which contains the glass net former component at a content rate of not less than a predetermined value to sum total thickness (T) of the (first) dielectric layer which does not contain the glass net former component at the content rate of not less than the predetermined value is a predetermined value or more (specifically 0.1 or more), and thereby the substrate and the inner layer electrode can be simultaneously sintered without an occurrence of a crack in the substrate, even when at least one portion of the inner layer electrode has a thickness of not less than 50 micrometers in a normal direction of the principal surface of the circuit board. As a result, in accordance with the production method of a circuit board according to the present embodiment, a reliable electronic circuit board can be provided, while attaining reduction in loss.

Hereafter, referring to an accompanying drawing etc., configurations of substrates and high-capacity modules according to some embodiments of the present invention, etc. will be explained. However, the explanation which will be described below is provided only for the purpose of exemplification, and the scope of the present invention should not be interpreted as to be limited to the following explanation.

EXAMPLE

Figure 4:
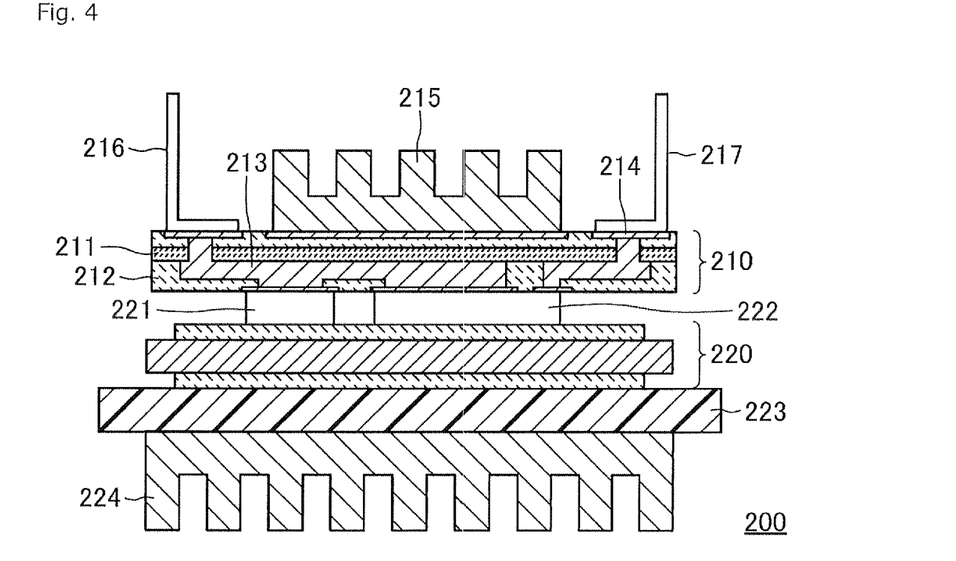
FIG. 4 A schematic view showing the configuration of a high-capacity module according to one embodiment of the present invention.

1. Configuration of a High-Capacity Module Including a Circuit Board According to an Embodiment of the Present Invention As mentioned previously, FIG. 4 is a schematic view showing the configuration of a high-capacity module including a circuit board according to one embodiment of the present invention. As shown in FIG. 4, a high-capacity module 200 including a circuit board 210 according to one embodiment of the present invention comprises an insulating board 220 on which a diode 221 and power IC 222 are disposed and a circuit board 210. Moreover, on the side opposite to the side, on which the diode 221 and power IC 222 are disposed, of the insulating board 220, a heat sink 224 is disposed via a heat dissipation base 223.

On the other hand, on the side opposite to the side which faces the insulating board 220 of the circuit board 210, a heat sink 215, a main terminal 216, and a control terminal 217 are disposed, respectively. Furthermore, the circuit board 210 includes a first dielectric layer 211 and a second dielectric layer 212, and an inner layer electrode 213 inside of the circuit board and a surface electrode 214 on the principal surface of the circuit board, respectively. In addition, in the circuit board 210, the first dielectric layer 211 is constituted by a first dielectric that has a dielectric constant higher than a second dielectric that constitutes the second dielectric layer 212. Therefore, the first dielectric layer 211 can function as a dielectric which constitutes a capacitor formed inside the circuit board 210. On the other hand, the second dielectric layer 212 contains a glass net former component at a content of a predetermined value or more. Moreover, the thickness of the inner layer electrode 213 in a normal direction of the principal surface of the circuit board 210 is not less than 50 micrometers as mentioned above. Furthermore, among two principal surfaces of the inner layer electrode 213, which are approximately parallel to the principal surfaces of the circuit board 210, the principal surface on the side of the heat sink 215 contacts with the first dielectric layer 211, and the principal surface on the side of the insulating board 220 contacts with the second dielectric layer 212.

By virtue of the above-described configuration, in the high-capacity module 200 shown in FIG. 4, heat which is generated from the diode 221 and the power IC 222 can be efficiently emitted outside by the heat sinks 215 and 224. Moreover, since an electric pathway which connects the power IC 222 and a capacitor can be shortened by embedding the capacitor, which uses the first dielectric layer 211 as a dielectric, inside the circuit board 210, not only a noise which is generated from the power IC 222 can be reduced, but also increase in a surge voltage which is induced sue to the noise can be suppressed.

Furthermore, in the high-capacity module 200 shown in FIG. 4, since the thickness of the inner layer electrode 213 is large enough (not less than 50 micrometers), increase in loss in the circuit board 210 can be suppressed. Moreover, among two principal surfaces of the inner layer electrode 213, which are approximately parallel to the principal surfaces of the circuit board 210, the principal surface on the side of the insulating board 220 contacts with the second dielectric layer 212 containing a glass net former component at a content rate of a predetermined value or more. Thereby, the second dielectric layer 212 can relax the stress resulting from difference of contraction profile between the inner layer electrode 213 and a substrate at the time when sintering the circuit board 210. As a result, in the circuit board 210, even though the inner layer electrode 213 which is thick (not less than 50 micrometers) as mentioned above is embedded inside, problems, such as an occurrence of a crack in a substrate at the time when sintering the circuit board 210 are reduced. Therefore, in accordance with the circuit board 210, problems that moisture may enter through the crack to lead to corrosion of the inner layer electrode and decrease in insulation property and further lead to disconnection of the inner layer electrode can be reduced and the reliability of the high-capacity module 200 can be improved.

2. Influence of Structure of a Circuit Board and Composition of a Dielectric on Occurrence of a Crack In the present example, influence of combination of various structures of a circuit board and various compositions of a dielectric on occurrence of a crack in a circuit board has been considered. Specifically, in circuit boards which have various structures with different contact situations of an inner layer electrode and a second dielectric layer, different ratios of the thickness (t/T) of the second dielectric layer to a first dielectric layer, and different thicknesses of the inner layer electrode, various circuit board samples have been manufactured using various first and second dielectrics which have different compositions, and an occurrence situation of a crack after sintering in each circuit board sample has been evaluated, respectively.

In addition, about the production method of each circuit board sample, since it is apparent to a person skilled in the art and it has been already mentioned in the above-mentioned statement about various embodiments of the present invention, explanation here is omitted. On the other hand, an occurrence situation of a crack after sintering in each circuit board sample was evaluated by an ultrasonic inspection. Detailed description of structures and compositions of various circuit board samples used for the evaluation on an occurrence situation of a crack in the present example will be given below.

(1) Various Structures for Circuit Board Samples

As mentioned previously, FIG. 5 is a schematic view showing various structures for circuit board samples according to various examples and comparative examples of the present invention. Herein, in order to explain easily, among two principal surfaces which a circuit board has, the principal surface on the side which faces a power semiconductor, such as a power IC, when incorporated in a high-capacity module (namely, lower side in FIG. 5) is referred to as a first surface, and the principal surface on the side which is opposite to the first surface (namely, upper side in FIG. 5) is referred to as a second surface. In the circuit board structures (a) to (f) shown in FIG. 5, a first surface electrode which is exposed on the first surface, a second surface electrode which is exposed on the second surface, and an inner layer electrode embedded inside the circuit board are disposed respectively. In addition, suppose that the configuration of these electrodes in all the circuit board structures (a) to (f) shown in FIG. 5.

Figure 5:
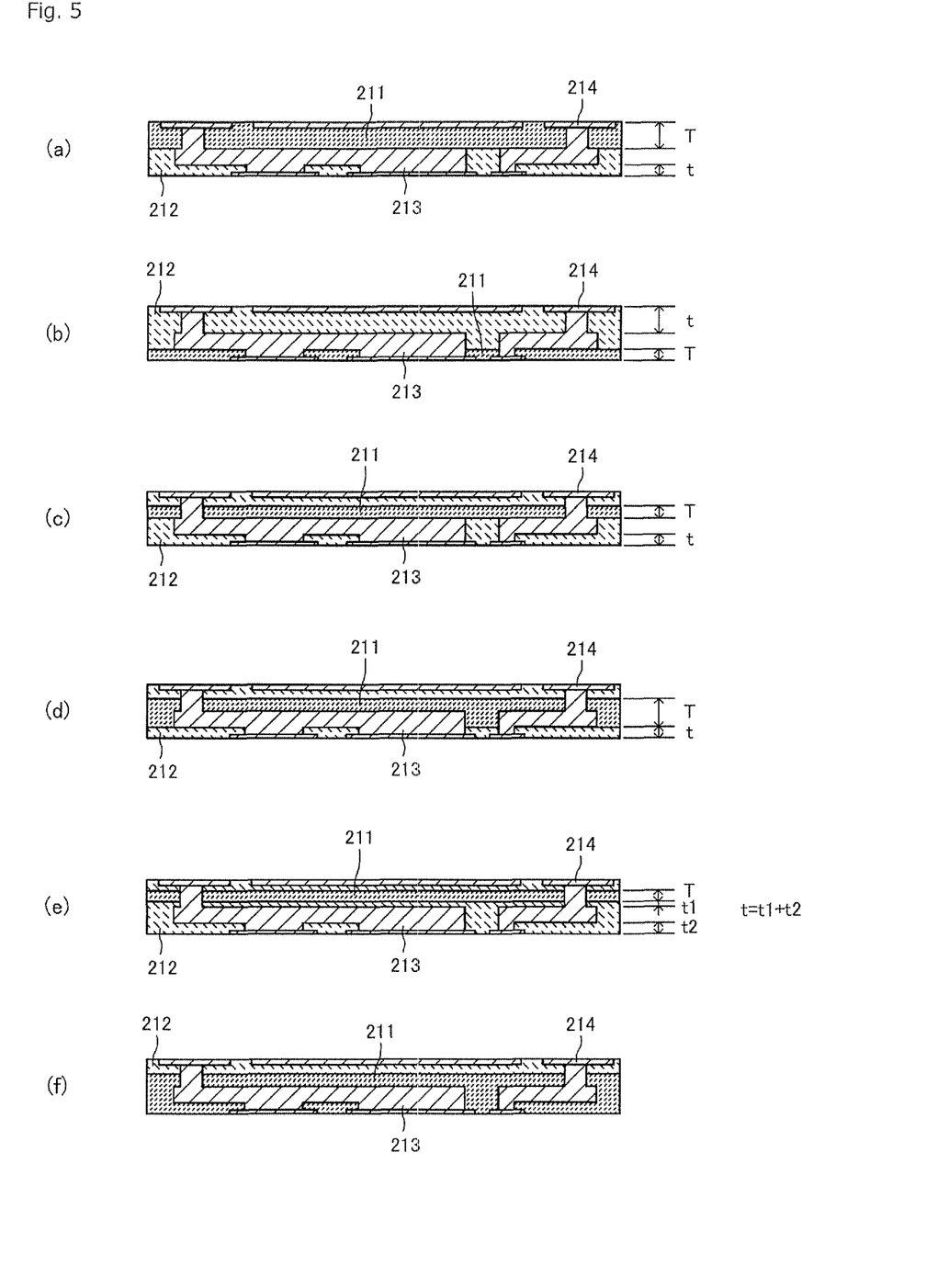
FIG. 5 A schematic view showing various structures for circuit board samples according to various examples and comparative examples of the present invention.

First, in the circuit board structure (a), as shown in FIG. 5 (a), the domain from a principal surface on the side of the second surface of the inner layer electrode to the second surface of the circuit board is constituted by the first dielectric layer, and the domain from a principal surface on the side of the second surface to the first surface of the circuit board of the inner layer electrode is constituted by the second dielectric layer. As a result, in the circuit board structure (a), the principal surface on the side of the second surface of the inner layer electrode contacts with the first dielectric layer, and the principal surface on the side of the first surface (and a lateral face) of the inner layer electrode contacts with the second dielectric layer. Therefore, the configuration of the circuit board structure (a) corresponds to a structure of a circuit board according to one embodiment of the present invention, as long as other requirements (thickness of each of dielectric layers and content of a glass net former component in the second dielectric) are satisfied. In addition, in the circuit board structure (a), sum total thickness T of the first dielectric layer corresponds to the distance between the principal surface on the side of the second surface of the inner layer electrode and the second surface of the circuit board, and sum total thickness t of the second dielectric layer corresponds to the distance between the principal surface on the side of the first surface of the inner layer electrode and the first surface of the circuit board.

Next, in the circuit board structure (b), as shown in FIG. 5 (b), the domain from the principal surface on the side of the first surface of the inner layer electrode to the second surface of the circuit board is constituted by the second dielectric layer, and the domain from the principal surface on the side of the first surface of the inner layer electrode to the first surface of the circuit board is constituted by the first dielectric layer. As a result, in the circuit board structure (b), the principal surface on the side of the first surface of the inner layer electrode contacts with the first dielectric layer, and the principal surface on the side of the second surface (and a lateral face) of the inner layer electrode contacts with the second dielectric layer. Therefore, the configuration of the circuit board structure (b) corresponds to a structure of a circuit board according to another embodiment of the present invention, as long as other requirements (thickness of each of dielectric layers and content of a glass net former component in the second dielectric) are satisfied. In addition, in the circuit board structure (b), sum total thickness T of the first dielectric layer corresponds to the distance between the principal surface on the side of the second surface of the inner layer electrode and the first surface of the circuit board, and sum total thickness t of the second dielectric layer corresponds to the distance between the principal surface on the side of the second surface of the inner layer electrode and the second surface of the circuit board.

Moreover, in the circuit board structure (c), as shown in FIG. 5 (c), the domain from the principal surface on the side of the second surface of the inner layer electrode to a plane (henceforth, referred to as an "intermediate plane 1") which is located in the middle of the principal surface on the side of the second surface of the inner layer electrode and the second surface of the circuit board and approximately parallel to the principal surface is constituted by the first dielectric layer, and another domain inside the circuit board is constituted by the second dielectric layer. As a result, in the circuit board structure (c), the principal surface on the side of the second surface of the inner layer electrode contacts with the first dielectric layer, and the principal surface on the side of the first surface (and a lateral face) of the inner layer electrode contacts with the second dielectric layer. Therefore, the configuration of the circuit board structure (c) corresponds to a structure of a circuit board according to another embodiment of the present invention, as long as other requirements (thickness of each of dielectric layers and content of a glass net former component in the second dielectric) are satisfied. In addition, in the circuit board structure (c), sum total thickness T of the first dielectric layer corresponds to the distance between the principal surface on the side of the second surface of the inner layer electrode and the above-mentioned intermediate plane 1, and sum total thickness t of the second dielectric layer corresponds to the distance between the principal surface on the side of the first surface of the inner layer electrode and the first surface of the circuit board.

Furthermore, in the circuit board structure (d), as shown in FIG. 5 (d), the domain from the principal surface on the side of the first surface of the inner layer electrode to a plane (henceforth, referred to as an "intermediate plane 2") which is located in the middle of the principal surface on the side of the first surface of the inner layer electrode and the second surface of the circuit board and approximately parallel to the principal surface is constituted by the first dielectric layer, and another domain inside the circuit board is constituted by the second dielectric layer. As a result, in the circuit board structure (d), the principal surface on the side of the second surface (and a lateral face) of the inner layer electrode contacts with the first dielectric layer, and the principal surface on the side of the first surface of the inner layer electrode contact with the second dielectric layer. Therefore, the configuration of the circuit board structure (d) corresponds to a structure of a circuit board according to another embodiment of the present invention, as long as other requirements (thickness of each of dielectric layers and content of a glass net former component in the second dielectric) are satisfied. In addition, in the circuit board structure (d), sum total thickness T of the first dielectric layer corresponds to the distance between the principal surface on the side of the second surface of the inner layer electrode and the above-mentioned intermediate plane 2, and sum total thickness t of the second dielectric layer corresponds to the distance between the principal surface on the side of the first surface of the inner layer electrode and the first surface of the circuit board.

In addition, in the circuit board structure (e), as shown in FIG. 5 (e), the domain from a plane (henceforth, referred to as an "intermediate plane 3") which is located in the middle of the principal surface on the side of the second surface of the inner layer electrode and the second surface of the circuit board and approximately parallel to the principal surface to a plane (henceforth, referred to as an "intermediate plane 4") which is located in the middle of the intermediate plane 3 and the second surface of the circuit board and approximately parallel to the principal surface is constituted by the first dielectric layer, and another domain inside the circuit board is constituted by the second dielectric layer. As a result, in the circuit board structure (e), both of the principal surface on the side of the first surface of the inner layer electrode and the principal surface on the side of the second surface (and a lateral face) of the inner layer electrode contact with the second dielectric layer. Therefore, the configuration of the circuit board structure (e) corresponds to a structure of a circuit board according to another embodiment of the present invention, as long as other requirements (thickness of each of dielectric layers and content of a glass net former component in the second dielectric) are satisfied. In addition, in the circuit board structure (e), sum total thickness T of the first dielectric layer corresponds to the distance between the above-mentioned intermediate plane 3 and the above-mentioned intermediate plane 4, and sum total thickness t of the second dielectric layer corresponds to the sum of the distance (t2) between the principal surface on the side of the first surface of the inner layer electrode and the first surface of the circuit board and the distance (t1) between the principal surface on the side of the second surface of the inner layer electrode and the above-mentioned intermediate plane 3 (t=t1+t2).

On the other hand, in the circuit board structure (f), as shown in FIG. 5 (f), the domain from a plane (henceforth, referred to as an "intermediate plane 5") which is located in the middle of the principal surface on the side of the second surface of the inner layer electrode and the second surface of the circuit board and approximately parallel to the principal surface is constituted by the first dielectric layer, and the domain from the above-mentioned intermediate plane 5 to the second surface of the circuit board is constituted by the second dielectric layer. As a result, in the circuit board structure (f), both of the principal surface on the side of the first surface of the inner layer electrode and the principal surface on the side of the second surface (and a lateral face) of the inner layer electrode contact with the first dielectric layer, and do not contact with the second dielectric layer. Therefore, the configuration of the circuit board structure (f) does not correspond to a structure of a circuit board according to any of embodiments of the present invention, regardless of whether other requirements (thickness of each of dielectric layers and content of a glass net former component in the second dielectric) are satisfied or not (namely, it corresponds to a structure according to a conventional technology). In addition, in the circuit board structure (f), sum total thickness T of the first dielectric layer corresponds to the distance between the above-mentioned intermediate plane 5 and the first surface of the circuit board, and sum total thickness t of the second dielectric layer comes to 0 (zero) since there is not the second dielectric layer which contacts with any of the principal surfaces of the inner layer electrode (t=0 (zero)).

In addition, among the various above-mentioned circuit board structures, in the circuit board structure (c), (d), and (e), although the domain nearest to the first surface of the circuit board is all constituted by the second dielectric layer, the thickness of these second dielectric layers is not included in sum total thickness t of the second dielectric layer as mentioned previously. This is because the second dielectric layer which contacts with neither of two principal surfaces which an inner layer electrode has cannot relax the stress resulting from difference of contraction profile between the inner layer electrode and the substrate at the time when sintering the circuit board.

(2) Composition of Various Dielectric Raw Materials as the First Dielectric

Next, in the present example, as the first dielectrics that constitute the first dielectric layer of various above-mentioned circuit boards, two kinds of dielectric raw materials shown below were prepared.

<<Dielectric Raw Material 1-1>>

After calcination of a mixture of $BaCO_3$, $TiO_2$, $Nd_2O_3$, and $Bi_2O_3$ at 1100° C. to synthesize 0.16 BaO-0.675 $TiO_2$-0.14 $Nd_2O_3$-0.025 $Bi_2O_3$, it was pulverized. Into this pulverized object, 2 mass % of polysilicate system glass pulverized object was mixed as a calcination auxiliary agent to obtain a raw material 1-1 of the first dielectric. The dielectric constant of this dielectric raw material 1-1 after sintering at 900° C. was 80.

<<Dielectric raw material 1-2>>

After calcination of an equimolar mixture of $BaCO_3$ and $TiO_2$ at 1100° C. to synthesize $BaTiO_3$, it was pulverized. Into this pulverized object, 6 mass % in sum total of a mixture of $Bi_2O_3$, CuO, and ZnO was added as an accessory component to obtain the raw material 1-2 of the first dielectric. The dielectric constant of this dielectric raw material 1-2 after sintering at 900° C. was 2000.

(3) Composition of Various Dielectric Materials as the Second Dielectric

Next, in the present example, as the second dielectrics that constitute the second dielectric layer of various above-mentioned circuit boards, thirteen kinds of dielectric raw materials shown below were prepared.

<<The Dielectric Raw Material 2-1-1 to 10>>

After calcination of a mixture of $BaCO_3$, $TiO_2$, and ZnO at 1100° C. to synthesize BaO-4.5$TiO_2$-1.5ZnO, it was pulverized. To this pulverized object, $SiO_2$, $H_3BO_3$, and ZnO, together with $GeO_2$ or $P_2O_5$ if needed, after vitrification and pulverization, were added to obtain raw materials 2-1-1 to 10 of the second dielectrics. The additive rate [mass %] of $B_2O_3$ and $SiO_2$ in the ten kinds of dielectric raw materials obtained thus are shown in Table 1. Although the dielectric constants of these dielectric raw materials after sintering at 900° C. were different depending mainly on the additive rate of the above-mentioned glass net former component, all of them were smaller than those of the above-mentioned raw materials of the first dielectrics, and they presented the dielectric constants in a range of 15 to 35.

<<Dielectric raw material 2-2>>

After melting a mixture of $H_3BO_3$, $SiO_2$, $Al_2O_3$, and $CaCO_3$ at 1450° C. to obtain a glass net former with a composition of 0.09$B_2O_3$-0.58$SiO_2$-0.06$Al_2O_3$-0.27 CaO, it was pulverized. Into 60 mass % of this pulverized object, 40 mass % of alumina powder was mixed to obtain a raw material 2-2 of the second dielectric. The dielectric constant of this dielectric raw material after sintering at 900° C. was 8, it presented a dielectric constant smaller than that of the above-mentioned raw materials of the first dielectrics.

<<Dielectric raw material 2-3>>

After calcination of a mixture of $BaCO_3$, $Al_2O_3$, $SiO_2$, ZnO, and $Bi_2O_3$ at 1100° C., it was pulverized. To this pulverized object, what is obtained by adding ZnO to $SiO_2$ and $H_3BO_3$ to be vitrified and pulverizing the same was added so that its content rate is 2 mass % to obtain raw materials 2-3 of the second dielectric with a composition of 0.44BaO-0.43$SiO_2$-0.03$Al_2O_3$-0.03$Bi_2O_3$-0.06ZnO-0.01$B_2O_3$. The dielectric constant of this dielectric raw materials after sintering at 900° C. was 7, it presented a dielectric constant smaller than that of the above-mentioned raw materials of the first dielectrics.

<<Dielectric Raw Material 2-4>>

After melting a mixture of $H_3BO_3$, $SiO_2$, and ZnO at 1400° C. to obtain a glass net former with a composition of 0.25$B_2O_3$-0.10$SiO_2$-0.65ZnO, it was pulverized. Into 40 mass % of this pulverized object, 60 mass % of alumina powder was mixed to obtain a raw material 2-4 of the second dielectric. The dielectric constant of this dielectric raw material after sintering at 900° C. was 8, it presented a dielectric constant smaller than that of the above-mentioned raw materials of the first dielectrics.

(3) Manufacture of Various Circuit Board Samples

By applying the various circuit board structures and the various dielectric raw materials which have been stated above, required numbers of sheets of dielectric material with a conductive pattern embedded inside thereof or formed on the surface thereof and/or sheets of dielectric material without a conductive pattern, with a thickness of 5 to 500 micrometers, were laminated to manufacture various circuit board samples. In this case, the thickness ratio (t/T) of the second dielectric layer to the first dielectric layer and the thickness of the inner layer electrode were changed to manufacture various circuit board samples, and an occurrence situation of a crack after sintering in each circuit board sample was evaluated respectively. The circuit board structure (BS), thickness of the inner layer electrode (Te), composition (Comp) and the thickness ratio (t/T) of the first dielectric and the second dielectric, and an existence or non-existence of a crack after sintering of the circuit board (Crack) in the various circuit board samples manufactured in the present example were listed in the following Table 1.

TABLE 1

|        |    |     | 1st Dielectric | 2nd Dielectric |         |         |              |     |       |
|--------|----|-----|----------------|----------------|---------|---------|--------------|-----|-------|
| Sample | BS | Te  | Comp           | Comp           | $SiO_2$ | $B_2O_3$ | $B_2O_3$ + $SiO_2$ | t/T | Crack |
| CE.A1  | a  | 200 | 1-1            | 2-1-1          | 1.5     | 4       | 5.5          | 0.1 | Exist |
| CE.A2  | a  | 200 | 1-1            | 2-1-2          | 2       | 5.2     | 7.2          | 0.1 | Exist |
| WE.A1  | a  | 200 | 1-1            | 2-1-3          | 2.3     | 6       | 8.3          | 0.1 | No    |
| WE.A2  | a  | 200 | 1-1            | 2-1-4          | 3       | 8       | 11           | 0.1 | No    |
| WE.A3  | a  | 200 | 1-1            | 2-2            | 34.8    | 5.4     | 40.2         | 0.1 | No    |
| WE.A4  | a  | 200 | 1-1            | 2-3            | 43      | 1       | 44           | 0.1 | No    |
| WE.A5  | a  | 200 | 1-1            | 2-1-3          | 2.3     | 6       | 8.3          | 0.2 | No    |

TABLE 1-continued

| Sample | BS | Te | 1st Dielectric Comp | 2nd Dielectric Comp | $SiO_2$ | $B_2O_3$ | $B_2O_3 + SiO_2$ | t/T | Crack |
|---|---|---|---|---|---|---|---|---|---|
| WE.A6 | a | 200 | 1-1 | 2-1-3 | 2.3 | 6 | 8.3 | 0.4 | No |
| WE.A7 | a | 200 | 1-1 | 2-1-3 | 2.3 | 6 | 8.3 | 1.0 | No |
| WE.A8 | a | 200 | 1-1 | 2-1-9 | 2 | 6 | 8.3 ($GeO_2 = 0.3$) | 0.1 | No |
| WE.A9 | a | 200 | 1-1 | 2-1-10 | 2 | 6 | 8.3 ($P_2O_5 = 0.3$) | 0.1 | No |
| WE.A10 | a | 200 | 1-1 | 2-4 | 4 | 10 | 14 | 0.1 | No |
| CE.A3 | a | 200 | 1-1 | 2-1-3 | 2.3 | 6 | 8.3 | 0.09 | Exist |
| CE.A4 | a | 40 | 1-1 | 2-1-1 | 1.5 | 4 | 5.5 | 0.1 | No |
| CE.A5 | a | 200 | 1-1 | 2-2 | 34.8 | 5.4 | 40.2 | 0.08 | Exist |
| CE.A6 | a | 200 | 1-1 | 2-3 | 43 | 1 | 44 | 0.09 | Exist |
| CE.A7 | a | 200 | 1-1 | 2-4 | 4 | 10 | 14 | 0.08 | Exist |
| CE.B1 | b, c | 200 | 1-1 | 2-1-5 | 3.8 | 1.5 | 5.3 | 0.1 | Exist |
| CE.B2 | b, c | 200 | 1-1 | 2-1-6 | 5 | 2 | 7 | 0.1 | Exist |
| WE.B1 | b, c | 200 | 1-1 | 2-1-7 | 6 | 2.4 | 8.4 | 0.1 | No |
| WE.B2 | b, c | 200 | 1-1 | 2-1-8 | 7.5 | 3 | 10.5 | 0.1 | No |
| WE.B3 | b, c | 100 | 1-1 | 2-1-8 | 7.5 | 3 | 10.5 | 0.2 | No |
| CE.B3 | b, c | 200 | 1-1 | 2-1-7 | 6 | 2.4 | 8.4 | 0.07 | Exist |
| CE.D1 | d | 100 | 1-2 | 2-1-1 | 1.5 | 4 | 5.5 | 0.1 | Exist |
| CE.D2 | d | 100 | 1-2 | 2-1-2 | 2 | 5.2 | 7.2 | 0.1 | Exist |
| WE.D1 | d | 100 | 1-2 | 2-1-3 | 2.3 | 6 | 8.3 | 0.1 | No |
| WE.D2 | d | 100 | 1-2 | 2-1-4 | 3 | 8 | 11 | 0.1 | No |
| CE.D3 | d | 100 | 1-2 | 2-1-3 | 2.3 | 6 | 8.3 | 0.06 | Exist |
| CE.D4 | d | 40 | 1-2 | 2-1-1 | 1.5 | 4 | 5.5 | 0.1 | No |
| CE.E1 | e | 50 | 1-2 | 2-1-5 | 3.8 | 1.5 | 5.3 | 0.1 | Exist |
| CE.E2 | e | 50 | 1-2 | 2-1-6 | 5 | 2 | 7 | 0.1 | Exist |
| WE.E1 | e | 50 | 1-2 | 2-1-7 | 6 | 2.4 | 8.4 | 0.1 | No |
| WE.E2 | e | 50 | 1-2 | 2-1-8 | 7.5 | 3 | 10.5 | 0.1 | No |
| CE.E3 | e | 50 | 1-2 | 2-1-7 | 6 | 2.4 | 8.4 | 0.08 | Exist |
| CE.E4 | e | 40 | 1-2 | 2-1-5 | 3.8 | 1.5 | 5.3 | 0.1 | No |
| CE.F1 | f | 200 | 1-2 | 2-1-8 | 7.5 | 3 | 10.5 | 0.1 | Exist |
| CE.F2 | f | 50 | 1-2 | 2-1-8 | 7.5 | 3 | 10.5 | 0.1 | Exist |

(4) Evaluation of Various Circuit Board Samples

A) Comparative Examples A1 to A7 and Working Examples A1 to A10

As shown in Table 1, the circuit board samples according to the comparative examples (CE.) A1 to A7 and the working examples (WE.) A1 to A10 were manufactured by using the above-mentioned dielectric raw material 1-1 as the first dielectric layer and the above-mentioned dielectric raw materials 2-1-1 to 4, 2-1-9 and 10, 2-2 to 2-4 as the second dielectric layer in the above-mentioned circuit board structure (a). In addition, in the circuit board samples according to CE. A1 to A7 and WE. A1 to A10, basically, the thickness of the inner layer electrode (in a normal direction of the principal surface of the circuit board) was set constant at 200 micrometers, and the ratio (t/T) of the thickness (t) of the second dielectric layer to the thickness (T) of the first dielectric layer (may be referred to as a "thickness ratio") was also set constant at 0.1. However, in order to investigate influence of a thickness ratio (t/T) on an occurrence situation of a crack, in the circuit board samples according to WE. A5, A6, and A7, and CE. A3, A5, A6, and A7, the value of the thickness ratio (t/T) were set at 0.2, 0.4, and 1.0, and 0.09, 0.08, 0.09, and 0.08, respectively. Moreover, in order to investigate influence of a thickness of an inner layer electrode on an occurrence situation of a crack, in the circuit board sample according to CE. A4, the thickness of the inner layer electrode was set at 40 micrometers.

As apparent from the evaluation results about the circuit board samples according to CE. A1 and A2 and WE. A1 to A10 which are shown in Table 1, even in the circuit board structure (a) where the thickness of the inner layer (Te) was not less than 50 micrometers, the thickness ratio (t/T) was 0.1 or more, and at least one principal surface of the inner layer electrode contacted with the second dielectric layer, when the content rate of the glass net former component in the second dielectric was less than 8 mass %, a crack was observed in the circuit board after sintering (CE. A1 and A2). On the other hand, when the content rate of the glass net former component in the second dielectric was 8 mass % or more, a crack was not observed in the circuit board after sintering (WE. A1 to A10). Moreover, among the circuit board samples according to WE. A1 to A10, also in the circuit board samples according to WE. A8 and A9 which contain $GeO_2$ and $P_2O_5$, respectively, as an additional component in a glass net former component, a crack was not observed in the circuit board after sintering similarly to the circuit board samples according to WE. A1 to A7 and A10 which do not contain these additional components. Thus, it was confirmed that, in order to suppress an occurrence of a crack in the circuit board after sintering, it is desirable that the content rate of a glass net former component in the second dielectric is 8 mass % or more.

Moreover, from comparison of the circuit board samples according to WE. A1 and A5 to A7 and CE. A3 which have the same configuration except for the point that the thickness ratios (t/T) differ, it was confirmed that it is desirable for a thickness ratio (t/T) to be 0.1 or more in order to suppress an occurrence of a crack in the circuit board after sintering. Similarly, also from comparison in a pair of the circuit board sample according to WE. A3 and the circuit board sample according to CE. A5, a pair of the circuit board sample according to WE. A4 and the circuit board sample according to CE. A6, and a pair of the circuit board sample according to WE. A10 and the circuit board sample according to CE. A7, where the circuit board samples in each pair have the same configuration except for the point that the thickness ratios (t/T) differ, it was confirmed anew that it is desirable for a thickness ratio (t/T) to be 0.1 or more in order to suppress an occurrence of a crack in the circuit board after sintering.

In addition, in the circuit board sample according to CE. A4, although the content rate of the glass net former component in the second dielectric was less than 8 mass % (specifically, 5.5 mass %), a crack was not observed in the circuit board after sintering. It is believed that this is because the stress resulting from difference of contraction profile between the inner layer electrode and the substrate at the time when sintering the circuit board was originally small since the thickness of the inner layer electrode was as small as 40 micrometers in the circuit board sample according to CE. A4.

B) Comparative Examples B1 to B3 and Working Examples B1 to B3

As shown in Table 1, the circuit board samples according to the comparative examples (CE.) B1 to B3 and the working examples (WE.) B1 to B3 were manufactured by using the above-mentioned dielectric raw material 1-1 as the first dielectric layer and the above-mentioned dielectric raw materials 2-1-5 to 8 as the second dielectric layer in the above-mentioned circuit board structures (b) and (c). In addition, also in the circuit board samples according to CE. B1 to B3 and WE. B1 to B3, basically, the thickness of the inner layer electrode was set constant at 200 micrometers, and the thickness ratio (t/T) was also set constant at 0.1. However, in order to investigate influence of a thickness ratio (t/T) on an occurrence situation of a crack, in the circuit board samples according to WE. B3 and CE. B3, the value of the thickness ratio (t/T) were set at 0.2 and 0.07, respectively. Moreover, in the circuit board sample according to WE. B3, the thickness of the inner layer electrode was set at 100 micrometers.

As apparent from the evaluation results about the circuit board samples according to CE. B1 to B3 and WE. B1 to B3 which are shown in Table 1, even in the circuit board structures (b) and (c) where the thickness of the inner layer (Te) was not less than 50 micrometers, the thickness ratio (t/T) was 0.1 or more, and at least one principal surface of the inner layer electrode contacted with the second dielectric layer, when the content rate of the glass net former component in the second dielectric was less than 8 mass %, a crack was observed in the circuit board after sintering (CE. B1 and B2). On the other hand, when the content rate of the glass net former component in the second dielectric was 8 mass % or more, a crack was not observed in the circuit board after sintering (WE. B1 and B2). Thus, it was confirmed anew that, in order to suppress an occurrence of a crack in the circuit board after sintering, it is desirable that the content rate of a glass net former component in the second dielectric is 8 mass % or more.

Moreover, the circuit board sample according to WE. B3 has the same configuration as that of the circuit board sample according to WE. B2 except for the point that the thickness of the inner layer electrode as small as 100 micrometers and the thickness ratio (t/T) is as large as 0.2. In the circuit board sample according to WE. B3 which has such configuration, a crack was not observed in the circuit board after sintering. It is believed that this is because the stress resulting from difference of contraction profile between the inner layer electrode and the substrate at the time when sintering the circuit board was sufficiently relaxed since the thickness of the inner layer electrode was comparatively as small as 100 micrometers while the thickness ratio (t/T) is comparatively as large as 0.2. Furthermore, the circuit board sample according to CE. B3 has the same configuration as that of the circuit board sample according to WE. B1 except for the point that the thickness ratio (t/T) is as small as 0.07. In the circuit board sample according to CE. B3 which has such configuration, a crack was observed in the circuit board after sintering. It is believed that this is because the stress resulting from difference of contraction profile between the inner layer electrode and the substrate at the time when sintering the circuit board was not sufficiently relaxed since the thickness ratio (t/T) is as small as 0.07.

D) Comparative Examples D1 to D4 and Working Examples D1 and D2

As shown in Table 1, the circuit board samples according to the comparative examples (CE.) D1 to D4 and the working examples (WE.) D1 and D2 were manufactured by using the above-mentioned dielectric raw material 1-2 as the first dielectric layer and the above-mentioned dielectric raw materials 2-1-1 to 4 as the second dielectric layer in the above-mentioned circuit board structure (d). In addition, in the circuit board samples according to CE. D1 to D4 and WE. D1 and D2, basically, the thickness of the inner layer electrode was set constant at 100 micrometers, and the thickness ratio (t/T) was also set constant at 0.1. However, in order to investigate influence of a thickness ratio (t/T) on an occurrence of a crack, in the circuit board samples according to CE. D3, the value of the thickness ratio (t/T) was set at 0.06. Moreover, in order to investigate influence of a thickness of an inner layer electrode on an occurrence of a crack, in the circuit board sample according to CE. D4, the thickness of the inner layer electrode was set at 40 micrometers.

As apparent from the evaluation results about the circuit board samples according to CE. D1 to D4 and WE. D1 and D2 which are shown in Table 1, even in the circuit board structure (d) where the thickness of the inner layer (Te) was not less than 50 micrometers, the thickness ratio (t/T) was 0.1 or more, and at least one principal surface of the inner layer electrode contacted with the second dielectric layer, when the content rate of the glass net former component in the second dielectric was less than 8 mass %, a crack was observed in the circuit board after sintering (CE. D1 and D2). On the other hand, when the content rate of the glass net former component in the second dielectric was 8 mass % or more, a crack was not observed in the circuit board after sintering (WE. D1 and D2). Thus, it was confirmed anew that, in order to suppress an occurrence of a crack in the circuit board after sintering, it is desirable that the content rate of a glass net former component in the second dielectric is 8 mass % or more.

Moreover, from comparison of the circuit board samples according to WE. D1 and CE. D3 which have the same configuration except for the point that the thickness ratios (t/T) differ, it was confirmed that it is desirable for a thickness ratio (t/T) to be 0.1 or more in order to suppress an occurrence of a crack in the circuit board after sintering. In addition, in the circuit board sample according to CE. D4, although the content rate of the glass net former component in the second dielectric was less than 8 mass % (specifically, 5.5 mass %), a crack was not observed in the circuit board after sintering. It is believed that this is because the stress resulting from difference of contraction profile between the inner layer electrode and the substrate at the time when sintering the circuit board was originally small since the thickness of the inner layer electrode was as small as 40 micrometers in the circuit board sample according to CE. D4.

E) Comparative Examples E1 to E4 and Working Examples E1 and E2

As shown in Table 1, the circuit board samples according to the comparative examples (CE.) E1 to E4 and the working examples (WE.) E1 and E2 were manufactured by using the above-mentioned dielectric raw material 1-2 as the first dielectric layer and the above-mentioned dielectric raw materials 2-1-5 to 8 as the second dielectric layer in the above-mentioned circuit board structure (e). In addition, in the circuit board samples according to CE. E1 to E4 and WE. E1 and E2, basically, the thickness of the inner layer electrode was set constant at 50 micrometers, and the thickness ratio (t/T) was also set constant at 0.1. However, in order to investigate influence of a thickness ratio (t/T) on an occurrence of a crack, in the circuit board samples according to CE. E3, the value of the thickness ratio (t/T) was set at 0.08. Moreover, in order to investigate influence of a thickness of an inner layer electrode on an occurrence of a crack, in the circuit board sample according to CE. E4, the thickness of the inner layer electrode was set at 40 micrometers.

As apparent from the evaluation results about the circuit board samples according to CE. E1 to E4 and WE. E1 and E2 which are shown in Table 1, even in the circuit board structure (e) where the thickness of the inner layer (Te) was not less than 50 micrometers, the thickness ratio (t/T) was 0.1 or more, and at least one principal surface of the inner layer electrode contacted with the second dielectric layer, when the content rate of the glass net former component in the second dielectric was less than 8 mass %, a crack was observed in the circuit board after sintering (CE. E1 and E2). On the other hand, when the content rate of the glass net former component in the second dielectric was 8 mass % or more, a crack was not observed in the circuit board after sintering (WE. E1 and E2). Thus, it was confirmed anew that, in order to suppress an occurrence of a crack in the circuit board after sintering, it is desirable that the content rate of a glass net former component in the second dielectric is 8 mass % or more.

Moreover, from comparison of the circuit board samples according to WE. E1 and CE. E3 which have the same configuration except for the point that the thickness ratios (t/T) differ, it was confirmed that it is desirable for a thickness ratio (t/T) to be 0.1 or more in order to suppress an occurrence of a crack in the circuit board after sintering. In addition, in the circuit board sample according to CE. E4, although the content rate of the glass net former component in the second dielectric was less than 8 mass % (specifically, 5.3 mass %), a crack was not observed in the circuit board after sintering. It is believed that this is because the stress resulting from difference of contraction profile between the inner layer electrode and the substrate at the time when sintering the circuit board was originally small since the thickness of the inner layer electrode was as small as 40 micrometers in the circuit board sample according to CE. E4.

F) Comparative Examples F1 and F2

As shown in Table 1, the circuit board samples according to the comparative examples (CE.) F1 and F2 were manufactured by using the above-mentioned dielectric raw material 1-2 as the first dielectric layer and the above-mentioned dielectric raw material 2-1-8 as the second dielectric layer in the above-mentioned circuit board structure (f). In addition, although the thickness ratio (t/T) was also set constant at 0.1 in both of the circuit board samples according to CE. F1 and F2, for the thickness of the inner layer (Te), it was set at 200 micrometers in the circuit board sample according to CE. F1, and it was set at 50 micrometers in the circuit board sample according to CE. F2.

As apparent from the evaluation results about the circuit board samples according to CE. F1 and F2 which are shown in Table 1, in both of the circuit board samples according to CE. F1 and F2, respectively having the thickness of the inner Layer electrode of 200 micrometers and 50 micrometers, although the content rate of the glass net former component in the second dielectric was 8 mass % or more and the thickness ratio (t/T) was 0.1, a crack was observed in the circuit board after sintering. It is believed that this is because the stress resulting from difference of contraction profile between the inner layer electrode and the substrate at the time when sintering the circuit board could not be sufficiently relaxed since, as mentioned previously, in the circuit board structure (f) which was adopted in the circuit board samples according to CE. F1 and F2, both of the principal surface on the side of the first surface of the inner layer electrode and the principal surface on the side of the second surface (and a lateral face) of the inner layer electrode contact with the first dielectric layer, and do not contact with the second dielectric layer.

(5) Conclusion

As mentioned above, it has been confirmed that, in a circuit board including a substrate consisting of dielectric layer(s) which mainly comprises ceramics and an inner layer electrode embedded inside the circuit board, by virtue of a configuration where the substrate comprises at least one first dielectric layer consisting of a first dielectric and at least one second dielectric layer consisting of a second dielectric containing 8 mass % or more of a glass net former component, and on at least one of the principal surfaces of the inner layer electrode which are parallel to the principal surfaces of the circuit board, the inner layer electrode and the second dielectric layer contact with each other, and the ratio t/T of sum total thickness t of the second dielectric layer in contact with the inner layer electrode in a normal direction of the principal surface of the circuit board to sum total thickness T of the first dielectric layer in a normal direction of the principal surface of the circuit board is 0.1 or more, the substrate and the inner layer electrode can be simultaneously sintered without an occurrence of a crack in the substrate.

In accordance with a circuit board according to the present invention, while suppressing loss in the circuit board by sufficiently enlarging the thickness of an inner layer electrode, at least one of the principal surfaces of the inner layer electrode which are parallel to the principal surface of the circuit board can contact with a second dielectric layer which contains a glass net former component at a content rate of a predetermined value or more, and the ratio t/T of thickness t of the second dielectric layer to thickness T of a first dielectric layer can be a predetermined value or more, and thereby a substrate and the inner layer electrode can be simultaneously sintered without an occurrence of a crack in the substrate. Therefore, in accordance with the circuit board according to the present invention, problems that moisture may enter through the crack to lead to corrosion of the inner layer electrode and decrease in insulation property and further lead to disconnection of the inner layer electrode can be reduced and the reliability of a high-capacity module using the circuit board can be improved.

Although some embodiments with specific configurations have been explained above for the objective of explaining the present invention, it is needless to say that the scope of the present invention is not limited to these exemplary embodiments, various modifications can be properly added thereto within the limits of the matter described in the claims and specification.

REFERENCE SIGNS LIST

100: a power module, 110: a first electronic circuit, 111: a first circuit board, 112: a pad for adhesion, 113: a power semiconductor element, 114: a case, 115: a heat sink, 116: a wire bond, 117: Direct bond copper, 120: a second electronic circuit, 121: a second circuit board, 122: surface electrode(s), 123: an inner layer electrode, 124: surface electrode(s), 125: a control circuit element, 126: capacitor, 200: a power module, 210: a circuit board, 211: a first dielectric layer, 212: a second dielectric layer, 213: an inner layer electrode, 214: surface electrode(s), 215: a heat sink, 216: a main terminal, 217: a control terminal, 220: An insulating board, 221: a diode, 222: a Power IC, 223: a heat dissipation base, and 224: a heat sink.

The invention claimed is:

1. A circuit board comprising a substrate which mainly comprises ceramics and an inner layer electrode which comprises a conductive material embedded inside said substrate, wherein:

said substrate comprises at least one first dielectric layer which consists of a first dielectric and at least one second dielectric layer which consists of a second dielectric, said second dielectric contains 8 mass % or more of a glass net former component, at least one portion of said inner layer electrode has two principal surfaces which are approximately parallel to principal surfaces of said circuit board and a thickness of not less than 50 micrometers in a normal direction of the principal surfaces of said circuit board, on at least one of said two principal surfaces which said inner layer electrode has, said inner layer electrode and said second dielectric layer contact with each other, a ratio t/T of sum total thickness t of said second dielectric layer in contact with said inner layer electrode in a normal direction of the principal surface of said circuit board to sum total thickness T of said first dielectric layer in a normal direction of the principal surface of said circuit board is 0.1 or more, and said first dielectric layer, said second dielectric layer and said inner layer electrode are simultaneously sintered.

2. The circuit board according to claim 1, wherein:

the dielectric constant of said first dielectric is larger than the dielectric constant of said second dielectric, and said first dielectric layer constitutes a capacitor.

3. The circuit board according to claim 1, wherein:

said glass net former component comprises at least either one of silica dioxide ($SiO_2$) and diboron trioxide ($B_2O_3$).

4. The circuit board according to claim 1, wherein:

said conductive material comprises at least any one sort of gold (Au), silver (Ag), and copper (Cu).

5. A production method of a circuit board, to obtain a circuit board comprising a substrate which mainly comprises ceramics and an inner layer electrode which comprises a conductive material embedded inside said substrate, wherein:

said substrate comprises at least one first dielectric layer which consists of a first dielectric and at least one second dielectric layer which consists of a second dielectric, said second dielectric contains 8 mass % or more of a glass net former component, at least one portion of said inner layer electrode has two principal surfaces which are approximately parallel to principal surfaces of said circuit board and a thickness of not less than 50 micrometers in a normal direction of the principal surfaces of said circuit board, on at least one of said two principal surfaces which said inner layer electrode has, said inner layer electrode and said second dielectric layer contact with each other, a ratio t/T of sum total thickness t of said second dielectric layer in contact with said inner layer electrode in a normal direction of the principal surface of said circuit board to sum total thickness T of said first dielectric layer in a normal direction of the principal surface of said circuit board is 0.1 or more, and said first dielectric layer, said second dielectric layer and said inner layer electrode are simultaneously sintered.

6. The production method of a circuit board according to claim 5, wherein:

the dielectric constant of said first dielectric is larger than the dielectric constant of said second dielectric, and said first dielectric layer constitutes a capacitor.

7. The production method of a circuit board according to claim 5, wherein:

said glass net former component comprises at least either one of silica dioxide ($SiO_2$) and diboron trioxide ($B_2O_3$).

8. The production method of a circuit board according to claim 5, wherein:

said conductive material comprises at least any one sort of gold (Au), silver (Ag), and copper (Cu).

9. The circuit board according to claim 2, wherein:

said glass net former component comprises at least either one of silica dioxide ($SiO_2$) and diboron trioxide ($B_2O_3$).

10. The circuit board according to claim 2, wherein:

said conductive material comprises at least any one sort of gold (Au), silver (Ag), and copper (Cu).

11. The circuit board according to claim 3, wherein:

said conductive material comprises at least any one sort of gold (Au), silver (Ag), and copper (Cu).

12. The production method of a circuit board according to claim 6, wherein:

said glass net former component comprises at least either one of silica dioxide ($SiO_2$) and diboron trioxide ($B_2O_3$).

13. The production method of a circuit board according to claim 6, wherein:

said conductive material comprises at least any one sort of gold (Au), silver (Ag), and copper (Cu).

14. The production method of a circuit board according to claim 7, wherein:

said conductive material comprises at least any one sort of gold (Au), silver (Ag), and copper (Cu).

\* \* \* \* \*